United States Patent [19]
Ohashi

[11] Patent Number: 5,398,252
[45] Date of Patent: Mar. 14, 1995

[54] INTEGRATED CIRCUIT TESTER
[75] Inventor: Kazuhiko Ohashi, Tokyo, Japan
[73] Assignee: Kabushiki Kaisha Toshiba, Kawasaki, Japan
[21] Appl. No.: 794,894
[22] Filed: Nov. 20, 1991
[30] Foreign Application Priority Data
Nov. 21, 1990 [JP] Japan .................................. 2-314119
[51] Int. Cl.$^6$ ...................... G06F 11/00; G01R 31/28
[52] U.S. Cl. .................................................. 371/25.1
[58] Field of Search ...................... 371/25.1, 27, 20.4, 371/20.1, 15.1; 324/73.1, 158 R

[56] References Cited
U.S. PATENT DOCUMENTS
4,493,045 1/1985 Hughes, Jr. ............................ 364/580
4,773,071 9/1988 Nielsen ................................. 371/25
5,144,225 9/1992 Talbot et al. ........................ 324/73.1

Primary Examiner—Robert W. Beausoliel, Jr.
Assistant Examiner—Phung Chung
Attorney, Agent, or Firm—Foley & Lardner

[57] ABSTRACT

An integrated circuit tester uses the information compared between a test executed result and an expected value, for the operation of a driver, which applies test patterns to a device under test. Once a test executed result obtained from the device is compared with an expected value, the compared information is fedback to the driver so as to specify, for example, test cycles and test patterns. Therefore, in an evaluation of maximum operating frequencies, the failure which occurs in the (n+1)th lower frequency can be effectively observed without being masked by other failures which occur in the nth lower frequency or less.

10 Claims, 6 Drawing Sheets

| CLOCK | DRIVER PATTERN | COMPARATOR PATTERN |
|---|---|---|
| 1 st CLOCK | 0 0 0 0    1 1 1 1 | L L L L    H H H H |
| 2 nd CLOCK | 0 0 0 1    1 1 1 0 | L L L H    H H H L |
| 3 rd CLOCK | 0 0 1 0    1 1 0 1 | L L H L    H H L H |
| 4 th CLOCK | 0 0 1 1    1 1 0 0 | L L H H    H H L L |
| 5 th CLOCK | 0 1 0 0    1 0 1 1 | L H L L    H L H H |
| 6 th CLOCK | 0 1 0 1    1 0 1 0 | L H L H    H L H L |
| 7 th CLOCK | 0 1 1 0    1 0 0 1 | L H H L    H L L H |
| 8 th CLOCK | 0 1 1 1    1 0 0 0 | L H H H    H L L L |
| 9 th CLOCK | 1 0 0 0    0 1 1 1 | H L L L    L H H H |
| 10 th CLOCK | 1 0 0 1    0 1 1 0 | H L L H    L H H L |
| 11 th CLOCK | 1 0 1 0    0 1 0 1 | H L H L    L H L H |
| 12 th CLOCK | 1 0 1 1    0 1 0 0 | H L H H    L H L L |
| 13 th CLOCK | 1 1 0 0    0 0 1 1 | H H L L    L L H H |
| 14 th CLOCK | 1 1 0 1    0 0 1 0 | H H L H    L L H L |
| 15 th CLOCK | 1 1 1 0    0 0 0 1 | H H H L    L L L H |
| 16 th CLOCK | 1 1 1 1    0 0 0 0 | H H H H    L L L L |

| CLOCK | DRIVER PATTERN | COMPARATOR PATTERN | FAIL | OPERATING FREQUENCY | FLIP FLOP OUTPUT |
|---|---|---|---|---|---|
| 1 st CLOCK | 0 0 0 0 | L L L L  H H H H | | | |
| 2 nd CLOCK | 0 0 0 1 | L L L H  H H H L | | | |
| 3 rd CLOCK | 0 0 1 0 | L L H L  H H L H | | | |
| 4 th CLOCK | 0 0 1 1 | L L H H  H H L L | | | |
| 5 th CLOCK | 0 1 0 0 | L H L L  H L H H | 3rd FAIL | 7MHz | LHHH  HHHH |
| 6 th CLOCK | 0 1 0 1 | L H L H  H L H L | | | |
| 7 th CLOCK | 0 1 1 0 | L H H L  H L L H | | | |
| 8 th CLOCK | 0 1 1 1 | L H H H  H L L L | 1st FAIL | 5MHz | HLHL  LHLL |
| 9 th CLOCK | 1 0 0 0 | H L L L  L H H H | | | |
| 10 th CLOCK | 1 0 0 1 | H L L H  L H H L | 4th FAIL | 8MHz | HHHH  LLHL |
| 11 th CLOCK | 1 0 1 0 | H L H L  L H L H | | | |
| 12 th CLOCK | 1 0 1 1 | H L H H  L H L L | 2nd FAIL | 6MHz | LHHH  HLLL |
| 13 th CLOCK | 1 1 0 0 | H H L L  L L H H | | | |
| 14 th CLOCK | 1 1 0 1 | H H L H  L L H L | | | |
| 15 th CLOCK | 1 1 1 0 | H H H L  L L L H | | | |
| 16 th CLOCK | 1 1 1 1 | H H H H  L L L L | | | |

INTEGRATED CIRCUIT TESTER

BACKGROUND OF THE INVENTION

1. Field of the Invention

This invention relates to an integrated circuit tester to execute functional tests of integrated circuits. More particulary, it relates to an integrated circuit tester in which fail observations in the evaluation, for example, of maximum operating frequencies can be carried out effectively.

2. Description of the Prior Art

Recently, the input-output timing relation in an integrated circuit (e.g., a microprocessor) has become complicated due to the increase of input-output pins and the high function and high integration of intergrated circuits. As a result, the test method of an integrated circuit has become complicated and large scaled. From the view point of designing, a scan path method and an incorporated test method have been developed to cope with the problem mentioned above, and to simplify the test method. On the other hand, from the view point of test method, the development of an integrated circuit tester (referred as LSI tester, below) has not followed the high function and high integration:of LSIs, thus causing difficulties for developing and producing LSIs.

An example of the prior art LSI tester mentioned above is shown in FIG. 1. This LSI tester is comprised of the following: an input part (e.g., keyboard) 51, through which test pattern names required to execute tests, test conditions, such as supply voltages and test periods, are input; a control part 53, which indicates driver patterns (high level output, low level output), comparator patterns (high level comparing signal, low level comparing signal), test priods, set-up hold positions, and strobe positions for each clock, to a driver 55 and a comparator 57 (which will be mentioned below); the driver 55 which outputs driver patterns to a device under test 61 (referred as DUT below) according to the instruction by control part 53; the comparator 57 which compares a comparator pattern with the output from DUT 61 according to the instruction by control part 53; and a display 59 which indicates test results.

The basic operation of the LSI tester will be explained below.

Figure 1:
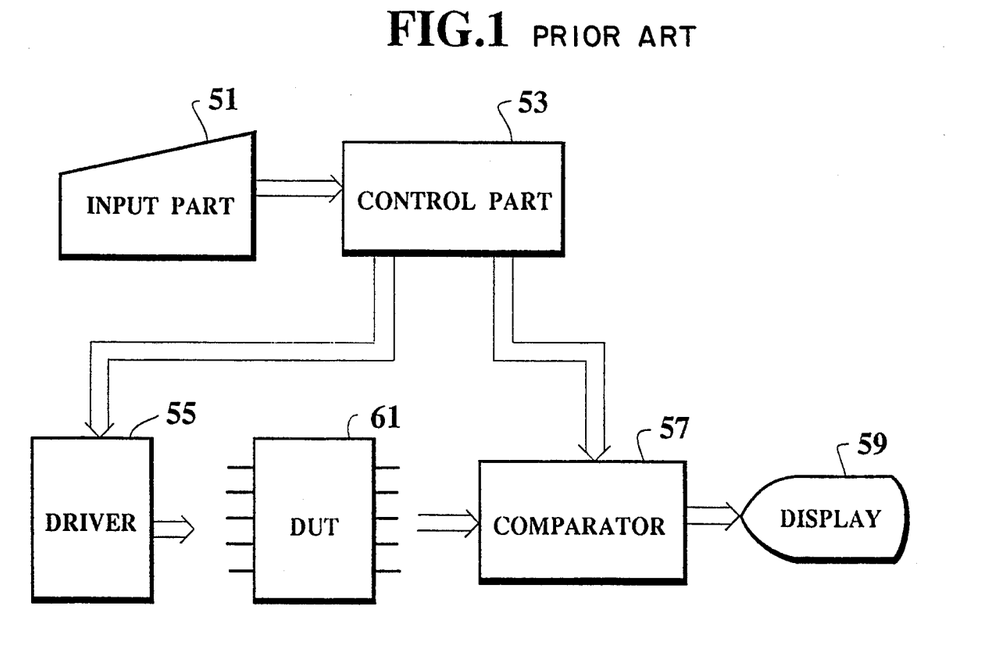
FIG. 1 is a block diagram showing the structure of an LSI tester according to the prior art.

Assume that DUT 61 has a scan function, and outputs informations contained in flip-flops and registers when particular pins are activated. In this case, test conditions are input through input part 51 first. Having recieved the test conditions, control part 53 gives instructions to driver 55 so that a test pattern is applied on DUT 61, and then, gives instruction to comparator 57 so that the output from DUT 61 is compared with an expected value. The compared result is, then, indicated on display 59.

Among the various tests which are executed during the development of an LSI, there is a test about the evaluation of maximum operating frequencies. This evaluation is carried out in the following way. The first fail clock, which has the biggest influence the operating frequency, is checked first. The reason why the operating speed is slow in that clock is due to a particular circuit which is operated under that clock. Therefore, an investigation into the cause of the first fail is conducted next, to find if there are any defects in designing. Once any defects are found, these should be repaired in the particular circuit.

Figure 2:
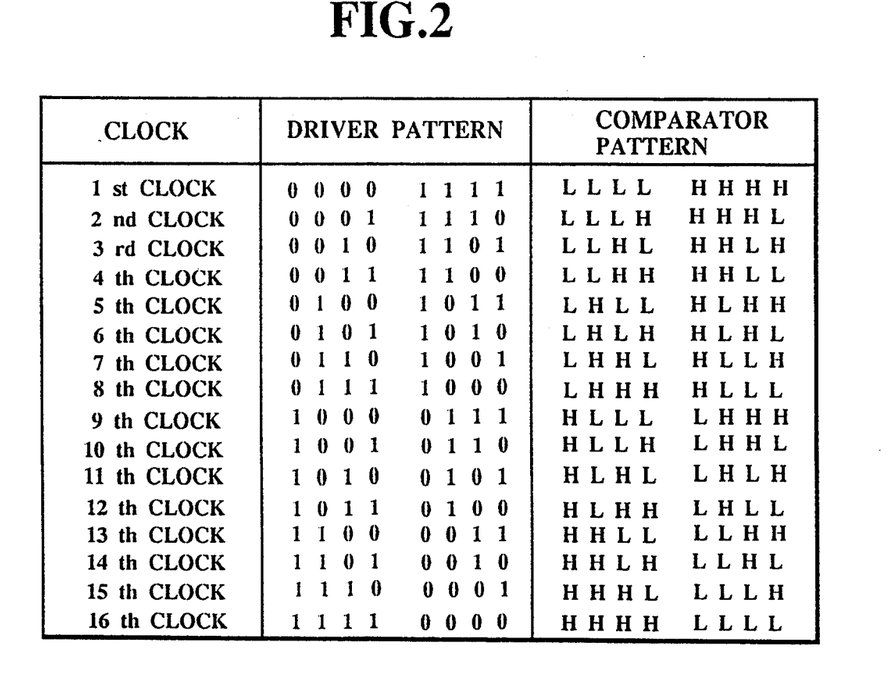
FIG. 2 shows test patterns used to measure maximum operating frequencies.

In reality, when the test is executed using a particular driver pattern of one clock contained in the test patterns shown in FIG. 2, and when the output from DUT 61, operated with the lowest operating frequency, does not coincide with a comparator pattern, i.e., an expected value, then, that clock is called the first fail clock. And, the clock, in which a fail occurs with the next lower operating frequency, is called the second fail clock.

Figure 3:
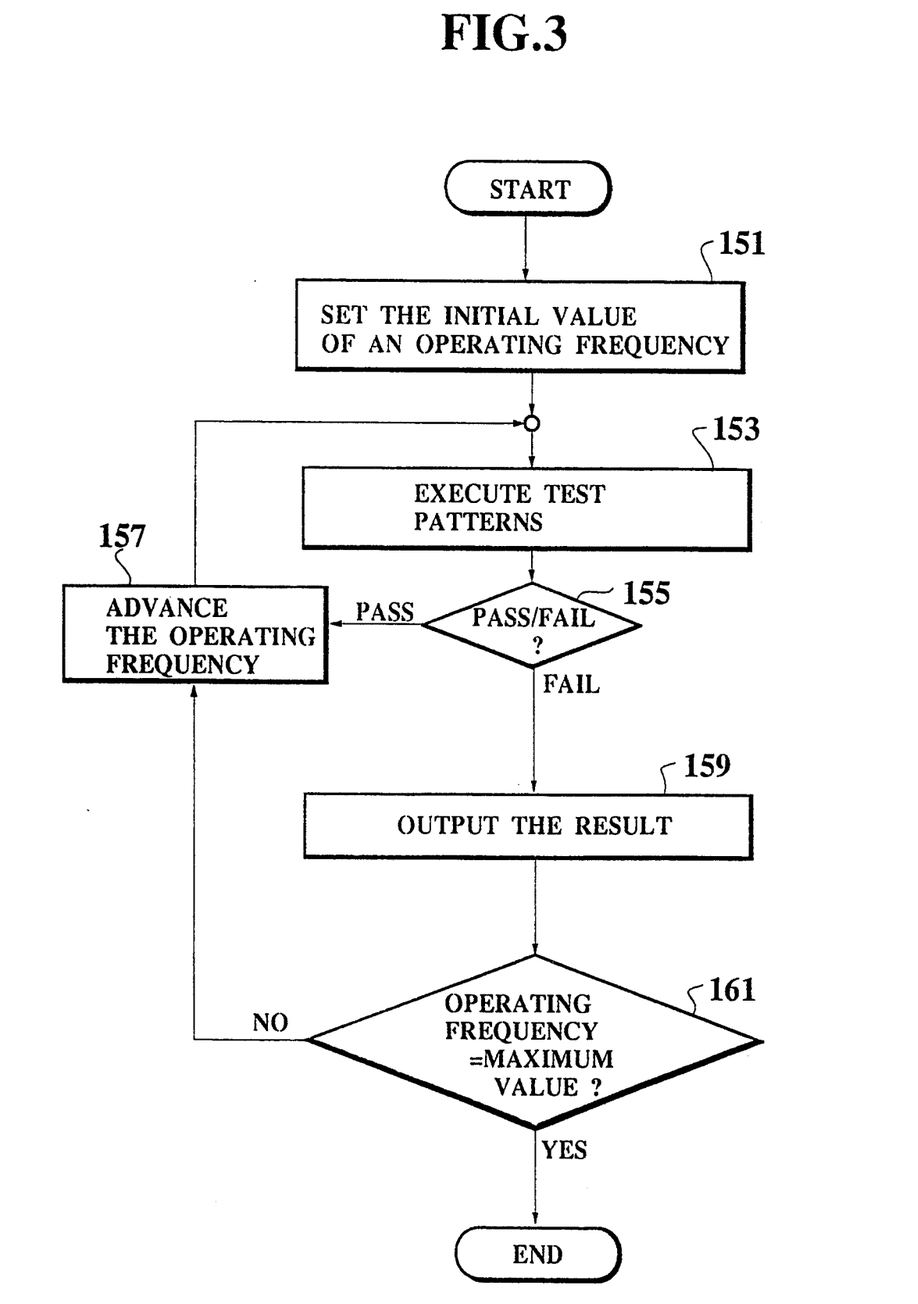
FIG. 3 is a flowchart showing the procedure of the measurement of maximum operating frequencies using the prior art LSI tester.

The procedure to measure maximum operating frequencies using the LSI tester shown in FIG. 1 will be explained next by referring to FIG. 3.

First, an initial value (e.g., 1 MHz) of the operating frequency is set in step 151, and a test pattern is executed in step 153. Next, whether the test pattern has passed or failed, is Judged in step 155. If the test pattern has passed, it means that the operating frequency has not reached to the maximum value. Therefore, the frequency is advanced (e.g., by 1 MHz) in step 157, in order to execute the test pattern again in step 153. In the case where the test pattern has failed in that frequency, it means that the frequency is above the maximum operating frequency. Therefore, if it is the first fail, the executed result is output as the first fail in step 159. Next, in step 161, the operating frequency is examined if it is the predetermined maximum value or not. In the case where the frequency coincides with the predetermined value, the procedure goes to the end. On the other hand, if it has not reached the predetermined value, the operating frequency is advanced in step 157 and the procedure returns to step 153 to check the next fail existence.

According to the procedure mentioned above, it is possible to find the first fail clock. However, the next fail clock, i.e., the second fail clock sometimes cannot be observed because it is overlapped or masked by the first fail clock. For example, when a first fail occurs at the 8th clock of the operating frequency 5 MHz in the test pattern shown in FIG. 2, the second fail existing between the first clock and the 7th clock can be observed. On the contrary, when a second fail exists between the 8th clock and the 16th clock, it cannot be observed. This is because the second fail is overlapped or masked by the first fail. (In those cases, the second fail is hidden by the first fail which has occurred first by the first fail clock, even if the operating frequency is so advanced.)

A concrete example of the measurement of maximum operating frequencies will be .explained below using a microprocessor which contains an adder (a circuit to execute an addition), a shifter (a circuit to execute a shift), and a multiplier (a circuit to execute a multiplication) as circuit blocks. To inspect such a microprocessor, usually, machine word instructions such as ADD instructions for an adder, SHF instructions for a shifter, and MUL instructions for a multiplier, are input from external. In general, the maximum operating frequency of each circuit block varies for each other so that these are assumed as 13 MHz for an adder, 12 MHz for a shifter, and 11 MHz for a multiplier here by way of explanation. (In fact, those are found as a result of measurements.)

In order to measure the maximum operating frequency of this microprocessor, the following 6 patterns can be expected as the test patterns.

| | |
|---|---|
| a) first clock | ADD instruction |
| second clock | SHF instruction |
| third clock | MUL instruction |

-continued

|   |              |                 |
|---|--------------|-----------------|
| b)| first clock  | ADD instruction |
|   | second clock | MUL instruction |
|   | third clock  | SHF instruction |
| c)| first clock  | SHF instruction |
|   | second clock | ADD instruction |
|   | third clock  | MUL instruction |
| d)| first clock  | SHF instruction |
|   | second clock | MUL instruction |
|   | third clock  | ADD instruction |
| e)| first clock  | MUL instruction |
|   | second clock | ADD instruction |
|   | third clock  | SHF instruction |
| f)| first clock  | MUL instruction |
|   | second clock | SHF instruction |
|   | third clock  | ADD instruction |

Using the LSI tester shown in FIG. 1, the microprocessor is tested according to the test patterns a) to f). When the microprocessor was operated with 11 MHz, all test patterns passed. When the microprocessor was operated with 12 MHz, it failed at the clock of MUL instructions in each test pattern, thus finding the first fail. When the microprocessor was operated with 13 MHz, it failed at the clock of SHF instructions in test patterns a), c), and d), thus finding the second fail. In other test patterns, however, the microprocessor could not find the second fail because these had been masked by the first fail. Furthermore, when the microprocessor is operated with 14 MHz, it failed at the clock of ADD instructions in test patterns a) and b) to find third fails. In test pattern c), however, this third fail could not be found because it is masked by the second fail. Also, in test patterns d), e), and f), the third fail could not be found because it is masked by the first fail. In short, all fails can be observed by test pattern a), and the maximum operating frequencies can be measured for all circuit blocks. On the other hand, only some fails can be observed by other test patterns, and the maximum frequencies of circuit blocks corresponding to these fails can be measured. In usual, there are n factorial patterns combinations in a test pattern having n clocks. So that, it is very difficult to make an ideal test pattern, i.e., test pattern a), in the measurement of maximum operating frequencies.

As described above, according to the prior art LSI tester, the fail, which occurs by the (n+1)th lower operating frequency, cannot always be observed because it is masked or overlapped by the fails occured by the nth lower operating frequency or less. As a result, defects contained in DUTs cannot always be found by the prior art LSI testers.

SUMMARY OF THE INVENTION

This invention has been made to overcome the above mentioned problems of the prior art LSI testers.

Therefore, it is an object of the present invention to provide an LSI tester in which fail observations in the evaluation of maximum operating frequencies can be carried out effectively.

Figure 4A:
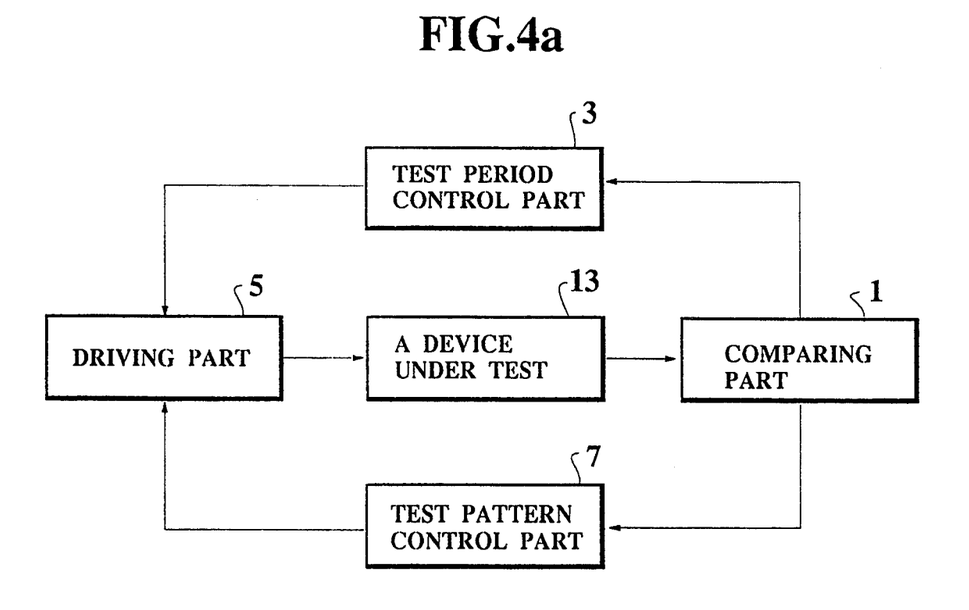
FIGS. 4a and 4b are block diagrams showing the schematic structures of LSI testers according to the present invention.

In one aspect of this invention, as shown in FIG. 4a, there is provided an LSI tester comprising: a comparing part 1 to compare test executed results obtained from a device under test (DUT) 13 with an expected value in each test cycle of a test pattern; a test period control part 3 to control the period of each test cycle which is applied to DUT 13 according to said compared information from said comparing part 1; a test pattern control part 7 to change the test pattern which is applied to said DUT 13 according to said compared information obtained from said comparing part 1; and a driving part 5 to apply test patterns onto said DUT 13 according to the instruction from said test period control part 3 and test pattern control part 7.

Figure 4B:
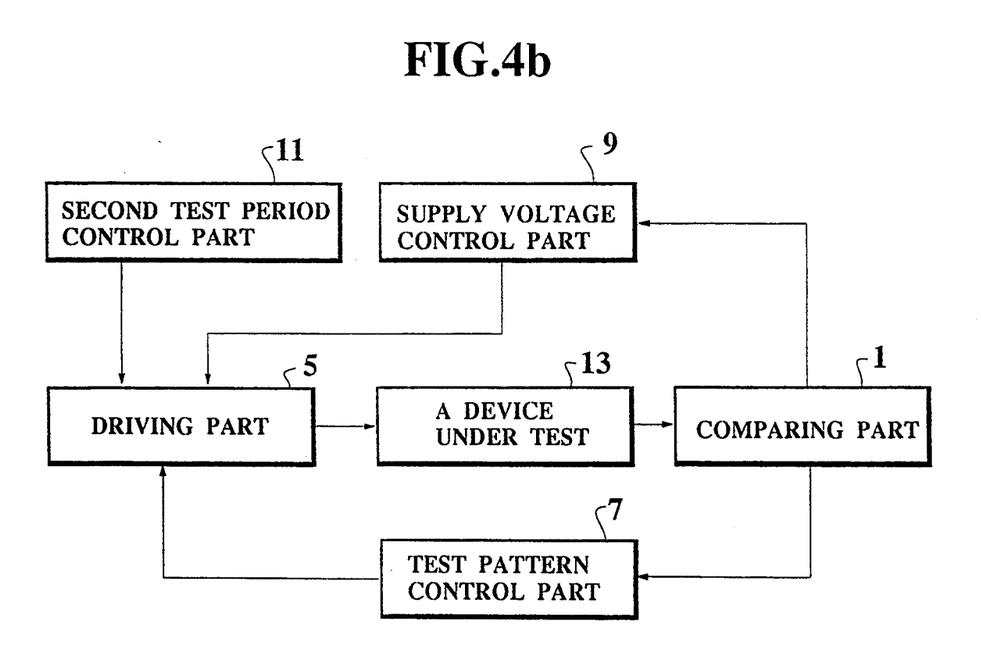

In another aspect of this invention, as shown in FIG. 4b, there is provided an LSI tester comprising: a comparing part 1 to compare test executed results obtained from DUT 13 with an expected value in each test cycle of a test pattern; a supply voltage control part 9 to control the supply voltage which is applied to said DUT 13 according to the compared information obtained from said comparing part 1; a test pattern control part 7 to change the test pattern which is applied to said DUT 13 according to the compared information obtained from said comparing part 1; a second test period control part 11 to change test periods; and a driving part 5 to apply test patterns onto said DUT 13 according to the instructions from said second test period control part 11, supply voltage control part 9, and test pattern control part 7.

According to the first aspect of the present invention, an executed test result from DUT 13 and an expected value are compared in comparing part 1. The compared result is, then, introduced into test period control part 3 and test pattern control part 7. After having received the compared information, test period control part 3 creates signals to control the periods of test cycles, each of which is applied to DUT 13 through driving part 5. On the other hand, test pattern control part 7 creates signals to change test patterns which are applied to DUT 13 through driving part 5, according to said compared information obtained from comparing part 1. As a result, driver 5 can specify the period of a test cycle and a test pattern against DUT 13, by reflecting the compared result obtained from comparing part 1.

According to the second aspect of the present invention, an executed test result from DUT 13 and an expected value are compared in comparing part 1. The compared result is, then, introduced into supply voltage control part 9 and test pattern control part 7. After having received the compared information, supply voltage control part 9 creates signals to control the supply voltage which is applied to DUT 13 through driving part 5. On the other hand, test pattern control part 7 creates signals to change test patterns which are applied to DUT 13 through driving part 5, according to said compared information obtained from comparing part 1. Also, the second test period control part 11 creates signals to control test periods, and outputs the control signals into driver 5. As a result, driver 5 can specify the magnitude of supply voltages and test patterns against DUT 13, by reflecting the compared result obtained from comparing part 1.

These and other objects, features and advantages of the present invention will be more apparent from the following description of preferred embodiments, taken in conjunction with the accompanying drawings.

DETAILED DESCRIPTION OF PREFERRED EMBODIMENTS

Figure 5:
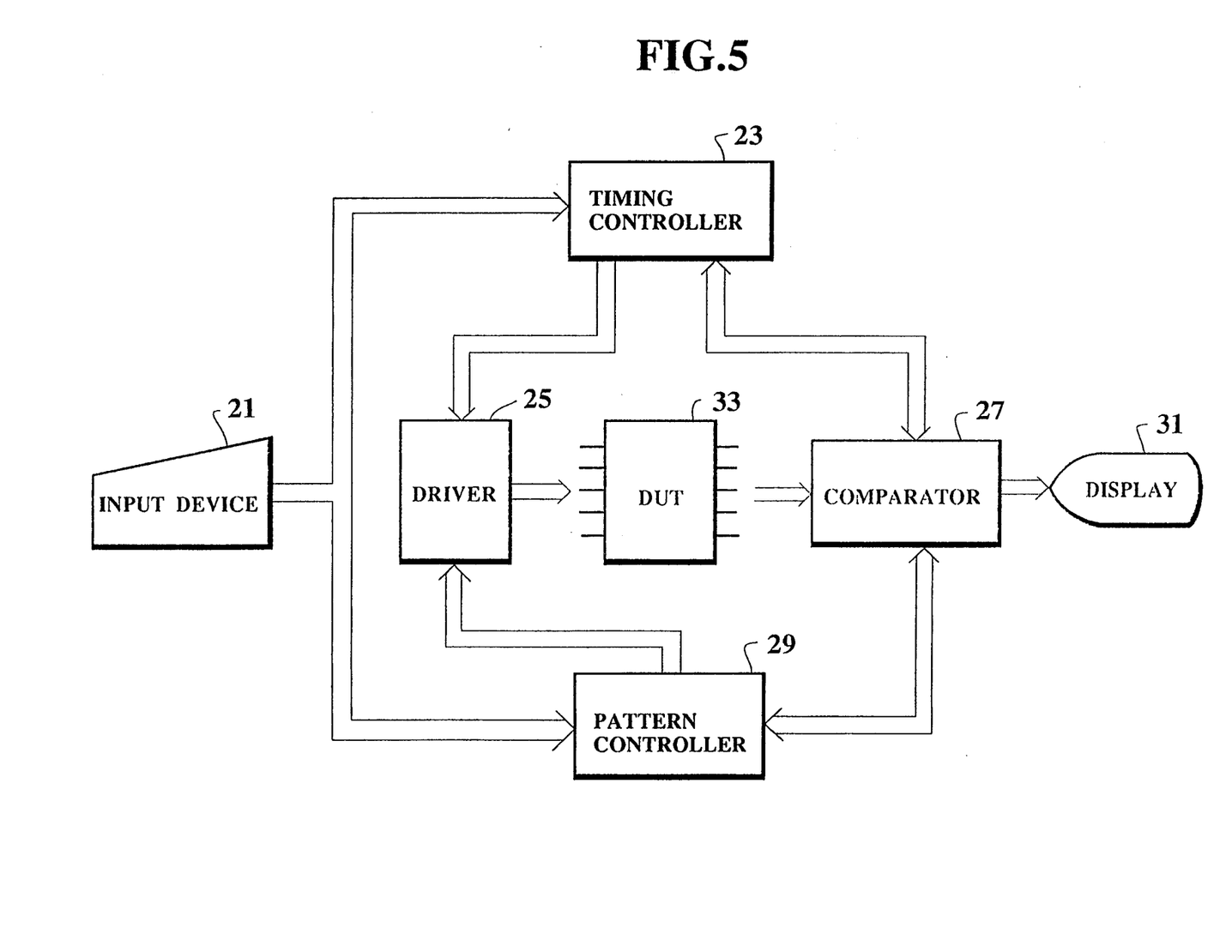
FIG. 5 is a block diagram showing the structure of an LSI tester according to one embodiment of the present invention.

FIG. 5 shows an LSI tester according to one embodiment of this invention. As shown in the figure, this tester includes the following: an input device (a keyboard, etc.) 21; a timing controller 23; a driver 25; a comparator 27; a pattern controller 29; and a display 31. In the figure, 33 means an LSI which will be inspected by the tester, called a device under test (DUT). Said input device 21 inputs test names, which are required to execute a test, and test conditions such as the magnitude of supply voltages, and the test periods. Timing controller 23 indicates test periods and set-up hold positions to driver 25, as well as test periods and strobe positions to comparator 27 for each clock. This controller 23 also receives compared results (pass/fail informations) from comparator 27. On the other hand, pattern controller 29 instructs driver patterns (high level output and low level output) to driver 25, and comparator patterns (high level comparing signal and low level comparing signal) to comparator 27 respectively. This pattern controller 29 also receives compared results from comparator 27. Driver 25 outputs dirver patterns, which are specified for each clock, into DUT 33 according to the instructions by timing controller 23 and pattern controller 29. Said comparator 27 compares the output from DUT 33 with comparator patterns according to the instructions by timing controller 23 and pattern controller 29. The compared result is indicated in display 31.

The basic operation of the LSI tester mentioned above will be explained below. To execute a test against DUT 33, test pattern names and test conditions are input through input device 21. Having received input signals, timing controller 23 and pattern controller 29 control driver 25 so that test patterns which have periods corresponding to each clock are applied to DUTY 33. Timing controller 23 and pattern controller 29 also control comparator 27 to compare the output from DUT 33 with expected values. The compared result from comparator 27 is, then, fedback to timing controller 23 and pattern conproller 29. The last result is, then, indicated in display 31.

Figure 6:
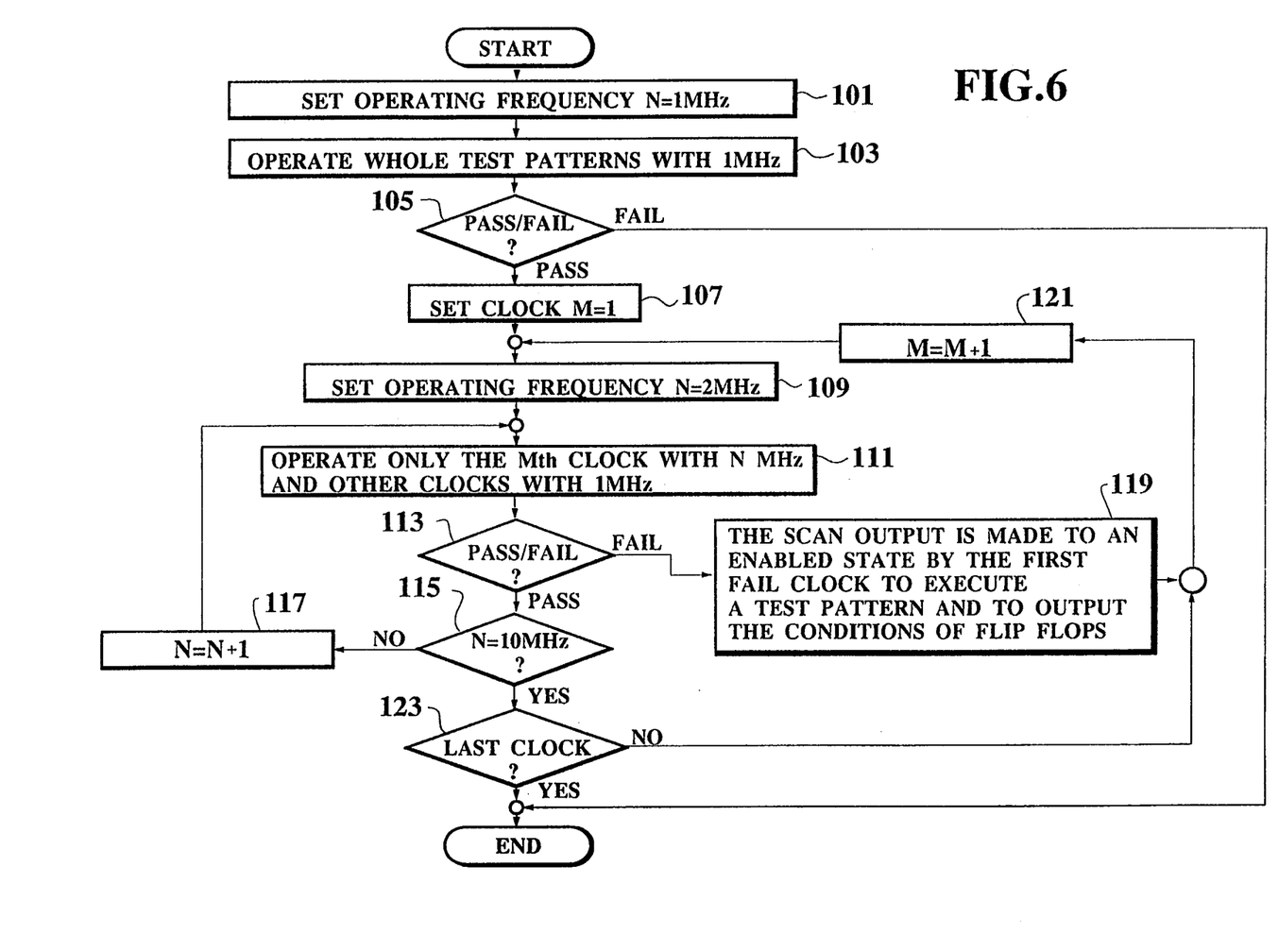
FIG. 6 is a flowchart showing the procedure of the measurement of maximum operating frequencies using the LSI tester shown in FIG. 5.

The procedure to measure maximum operating frequencies by the LSI tester shown in FIG. 5 will be explained below by referring to FIG. 6. By way of explanation, M is assumed to be the clock of a test pattern, and N is assumed to be the operating frequency. Also, the minimum operating frequency of the used LSI tester is assumed to be 1 MHz, and its maximum value is assumed to be 10 MHz. The operating frequency N can be changed by 1 MHz between said maximum and minimum values.

First, the operating frequency N is set to the minimum value, that is, 1 MHz, at step 101. Whole test patterns are executed at step 103. From the executed results, the generation of pass/fail is Judged at step 105. In the case of a fail generation, the test is evaluated as a functional defect, and it should be closed. On the other hand, in the case of a pass generation, the step is advanced to step 107. In this step, M is initialized to clock 1 (M=1), and at step 109, N is initialized to 2 MHz (N=2 MHz). Then, at step 111, only the Mth clock is operated with N MHz while the other clocks are operated with 1 MHz. The pass/fail generation of the executed result is judged at step 113. In the case of a pass generation, the operating frequency N is judged to determine whether it is the maximum value, i.e., 10 MHz or not, at step 115. When the operating frequency N has not reached the maximum value, value N is advanced by 1 MHz at step 117, and the step returns to step 111. In the case where a fail generation is found in step 113, a scan output is enabled by the first fail clock at step 119, in order to execute the test pattern again and to output flip-flop values in DUT 33. Then, at step 121, the clock is advanced by one clock to return to step 109. On the other hand, when the operating frequency N is found to be maximum at step 115, whether M clock is the last one or not, i.e., whether it is the end of the test pattern or not, is determined at step 123. When it is not the last one, the clock is advanced by one clock to return to step 109. On the contrary, if it is the last one, the step is advanced to the end. In short, against every particular clock, a particular test is executed by advancing the operating frequency by 1 MHz. During this test, when a fail generation is found, or the operating frequency N reaches the maximum value, the clock M is advanced to the next clock and the same test is repeated with this advanced clock. During the execution of the test, when a fail generation is found, flip-flop values in DUT 33 are output.

Figure 7:
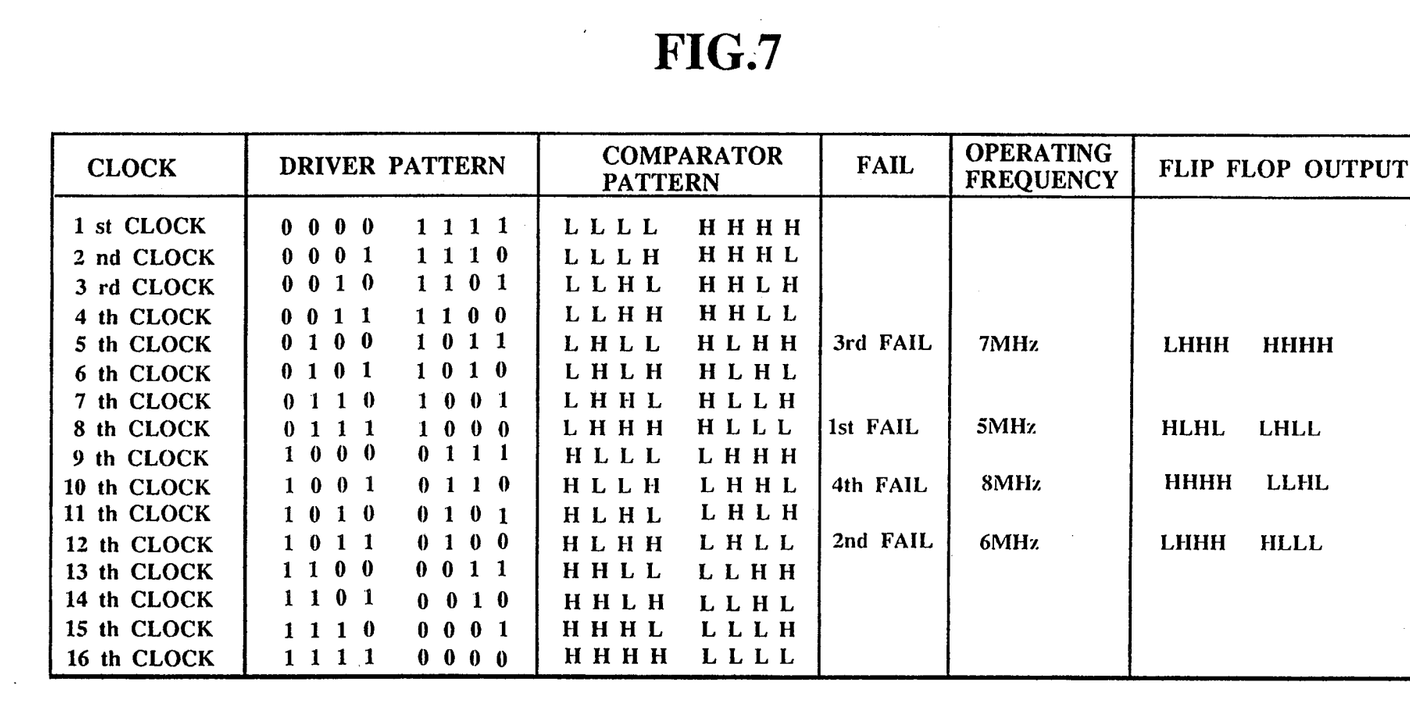
FIG. 7 shows test patterns used to measure maximum operating frequencies, and fail generations due to said test patterns.

FIG. 7 shows one example of fail generation and test patterns which are used in the measurement of maximum operating frequencies according to the above mentioned embodiment. It is apparent from this example that, for the first to 4th fails, the fail which is generated by the (n+1)th lower operating frequency can be observed without being masked by the fail which is generated by the nth lower operating frequency or less. So, a plurality of fails can be observed simultaneously in this embodiment.

As explained in the prior art device, in the case of a microprocessor in which an adder, a shifter, and a multiplier, are contained as circuit blocks, the fail which occurs by the (n+1)th lower operating frequency can be observed without being masked by any fails which occur by the nth lower operating frequency or less, using any of the patterns a) to f) shown in the explanation of the prior art device.

In the embodiment mentioned above, the period of a particular clock (one clock) was changed, however, a plurality of clocks can be changed. Also, only one clock was scanned when DUT 33 failed, however, a plurality of clocks can be scanned. Moreover, although the period of a particular clock was changed in this embodiment, another LSI tester, in which not only the period but the supply voltage are changed, can be easily realized using the LSI tester shown in FIG. 4b.

In summary, according to this invention, periods of test cycles and test patterns for DUTs are decided based on information compared between test executed results and expected values. Therefore, in the evaluation of maximum operating frequencies or the like, fails which occur by the (n+1)th lower operating frequency can be observed without being masked by other fails which occur with the nth lower operating frequency or less. So, an LSI tester, in which fails can be effectively observed, is realized with this invention.

What is claimed is:

1. An integrated circuit tester, comprising:
   a comparing means, connected to a device under test, for comparing test executed results obtained from said device under test with an expected value in each test cycle of a test pattern;
   a test period control means which is connected with said comparing means so as to receive compared information, said test period control means generating signals for controlling a period of each test cycle which is applied to said device under test according to said compared information from said comparing means;
   a test pattern control means which is connected with said comparing means so as to receive said compared information, said test pattern control means generating signals for changing the test pattern which is applied to said device under test according to said compared information obtained from said comparing means; and
   a driving means which is connected with said test period control means and said test pattern control means, said driving means applying test patterns onto said device under test according to controlling signals obtained from said test period control means and changing signals obtained from said test pattern control means.

2. An integrated circuit tester, comprising:
   a comparing means, connected to a device under test, for comparing test executed results obtained from said device under test with an expected value in each test cycle of a test pattern;
   a supply voltage control means which is connected with said comparing means so as to receive an output from said comparing means indicative of whether said expected value agrees with said test executed results, said supply voltage control means generating signals for controlling a supply voltage which is applied to said device under test according to compared information obtained from said comparing means;
   a test pattern control means which is connected with said comparing means so as to receive said compared information, said test pattern control means generating signals for changing the test pattern which is applied to said device under test according to said compared information obtained from said comparing means;
   a test period control means which is connected with said comparing means and which generates signals for controlling a period of said test pattern applied to said device under test; and
   a driving means which is connected with said supply voltage control means, said test pattern control means, and said test period control means, said driving means applying test patterns onto said device under test according to controlling signals from said supply voltage control means, changing signals from said test pattern control means, and controlling signals from said test period control means.

3. An integrated circuit tester, comprising:
   a comparator, connected to a device under test, to compare test executed results obtained from said device under test with an expected value in each test cycle of a test pattern;
   a timing controller, connected to an input device, for receiving a test pattern from said input device, said timing controller being connected bi-directionally with said comparator and generating signals for controlling a period of each test cycle, which is applied to said device under test, according to input information from said input device and compared information from said comparator;
   a pattern controller, connected to said input device, which receives input information from said input device, said pattern controller being connected bi-directionally with said comparator and generating control signals for changing the test pattern, which is applied to said device under test, according to input information from said input device and compared information from said comparator;
   a driver which is connected with said timing controller and said pattern controller, said driver applying test patterns onto said device under test according to control signals from said timing controller and from said pattern controller; and
   a display, connected to said comparator, for displaying compared results obtained from said comparator.

4. The integrated circuit tester as claimed in claim 3, wherein said comparator feedbacks said compared results into said timing controller and said pattern controller.

5. The integrated circuit tester as claimed in claim 3, wherein said input device is comprised of a keyboard.

6. The integrated circuit tester as claimed in claim 3, wherein said device under test includes an adder, a shifter, and a multiplier connected with each other to form a predetermined circuit.

7. The integrated circuit tester as claimed in claim 3, wherein said integrated circuit tester executes evaluations of maximum operating frequencies.

8. The integrated circuit tester as claimed in claim 7, wherein said timing controller instructs test periods and set-up hold positions to said driver, and also instructs test periods and strobe positions to said comparator.

9. The integrated circuit tester as claimed in claim 7, wherein said pattern controller indicates driver patterns to said driver, and also indicates comparing patterns to said comparator.

10. An integrated circuit tester for applying an operational test to a semiconductor device under test, comprising:
    a timing controller which receives test information concerning operational frequencies from an input device and generates signals for controlling the operational frequencies, which are applied to said semiconductor device under test, according to said test information;
    a pattern controller, connected to said input device, for receiving test information concerning a test pattern from said input device and for generating signals for controlling the test pattern, which are applied to said semiconductor device under test, according to said test information;
    a driver, connected to said timing controller and to said pattern controller, for receiving operational frequency control signals from said timing controller and test pattern control signals from said pattern controller and for applying said operational test to said semiconductor device under test according to said operational frequency control signals and said test pattern control signals;

a comparator which is connected bi-directionally with said timing controller and said pattern controller, said comparator comparing test executed results obtained from said semiconductor device under test with an expected value in each test cycle of a test pattern and sending a compared result to said timing controller and to said pattern controller; and a display, connected to said comparator, for displaying said compared result obtained from said comparator;

wherein said timing controller and said pattern controller receive said test executed results from said comparator to determine said operational frequency control signals based on said test executed results.

* * * * *